United States Patent
Koshikawa

[11] Patent Number: 5,991,231
[45] Date of Patent: Nov. 23, 1999

[54] SEMICONDUCTOR MEMORY DEVICE

[75] Inventor: Yasuji Koshikawa, Tokyo, Japan

[73] Assignee: NEC Corporation, Tokyo, Japan

[21] Appl. No.: 09/132,824

[22] Filed: Aug. 12, 1998

[30] Foreign Application Priority Data

Aug. 15, 1997 [JP] Japan .................................. 9-235343

[51] Int. Cl.[6] .............................................. G11C 8/00
[52] U.S. Cl. ........................................ 365/233; 365/236
[58] Field of Search ..................................... 365/236, 233, 365/189.05, 238.5

[56] References Cited

U.S. PATENT DOCUMENTS 5,621,698  4/1997  Lee ........................................... 365/233
5,886,553  3/1999  Matsui ..................................... 327/166

FOREIGN PATENT DOCUMENTS 61-148692  7/1986  Japan .
6-76566    3/1994  Japan .
7-45068    2/1995  Japan .

Primary Examiner—Amir Zarabian
Attorney, Agent, or Firm—McGinn & Gibb, P.C.

[57] ABSTRACT

An internal synchronous signal generating circuit outputs the internal synchronous signals ICLK1, ICLK2. A burst counter outputs an internal column address signal IADD and the lowermost internal column address signal IY0. A first and second D-F/Fs input an output of the input buffer and drives a first write bus (WBUS) in synchronization with the ICLK1. An inverting element inputs IY0. Inverting elements input outputs of the first and second D-F/Fs and drives a second write bus (WBUS). A transistor TG1 is connected between the first WBUS and second D-F/F. The gate is connected to the output of the first inverting element. A transistor TG2 is connected between the output of the second inverting element and second D-F/F with IY0 connected to the gate. A column decoder inputs IADD and outputs a column switch YSW. Sense amplifiers input the YSW and the second WBUS. A memory cell array is connected to the sense amplifiers through a bit line. By this device, the maximum consumptive current amount or an average consumptive current in the burst can be reduced.

4 Claims, 8 Drawing Sheets

SEMICONDUCTOR MEMORY DEVICE

BACKGROUND OF THE INVENTION

1. Field of the Invention

The present invention relates to a semiconductor memory device, more particularly to a data path control circuit designed to curtail the charge and discharge current of the data path.

2. Related Art

In recent years, with the acceleration in speed of CPU, demands for high speed operation of semiconductor memory device have enhanced. To meet such requirements there have been proposed the synchronous type semiconductor memory devices which work in synchronization with the external clocks exceeding 100 MHz. As the known literature on such kinds of semiconductor memory devices, references are made for example to Japanese Patent Application Laid-Open No. 61-148692 (Title of the Invention: "Memory Device"), Japanese Patent Application Laid-Open No. 6-76566 (Title of the Invention: "Semiconductor Memory Device"), Japanese Patent Application Laid-Open No. 7-45068 (Title of the Invention: "Synchronous Type Semiconductor Memory Device"), and the like.

An example of the constitutions of these conventional synchronous type semiconductor devices is shown in FIG. 7. Referring to FIG. 7, an input buffer 1 inputs an address signal ADD, an input buffer 2 inputs an external clock CLK and an input buffer 3 connected to a terminal DQ inputs written data. An internal synchronous signal generating circuit 5 inputs an output of the input buffer 2 and outputs an internal synchronous signal ICLK1 and ICLK2. A burst counter 12 inputs an output of the input buffer 1 and an internal synchronous signal ICLK1 and outputs an internal column address signal IADD. A D-type flip-flop (D-F/F) circuit 6 inputs an output of the input buffer 3 and drives a write bus WBUS1 in synchronization with the internal synchronous signal ICLK1. A D-F/F circuit 7 inputs a write bus WBUS1 and drives a write bus WBUS2 in synchronization with the internal synchronous signal ICLK2. A column decoder 8 inputs an internal column address signal IADD and outputs a column switch YSW. Sense amplifiers 9 input a column switch YSW and a write bus WBUS2. A memory cell array 10 is connected to the sense amplifiers 9 through a bit line.

An example of the operations of the conventional synchronous type semiconductor memory device is shown as a timing waveform diagram in FIG. 8. The internal synchronous signal ICLK1 is a pulse readily formed from the rising edge (transition from Low level to High level) of the external clock CLK, and the internal synchronous signal ICLK2 is a pulse formed after the predetermined delay from the internal synchronous signal ICLK1.

When Y=0 is given to an external address signal ADD at the rising edge of the external clock CLK in the C1 cycle which becomes the starting point of the writing operation, there are produced the internal column address IADD of Y=0, Y=1, Y=2, and Y=3, respectively, in the cycles of C1, C2, C3 and C4, in synchronization with the internal synchronous signal ICLK1. This is because this synchronous type semiconductor memory device has an operating function at the burst length 4, wherein, by the external address input of one time, the internal column address signals IADD of the number of burst length are formed in the burst counter 12.

The sequential order of this internal column address is determined by the external address signal in C1 cycle and the type of burst.

TABLE 1

Sequential type internal column address

| STARTING ADDRESS | | INTERNAL ADDRESS |
|---|---|---|
| A1 | A0 | SEQUENCE (DECIMAL) |
| 0 | 0 | 0,1,2,3 |
| 0 | 1 | 1,2,3,0 |
| 1 | 0 | 2,3,0,1 |
| 1 | 1 | 3,0,1,2 |

Table 1 shows a case where the type of the burst is a sequential type, in which, according to the logic level of the lower 2 bits (A1, A0) of the external address signal ADD in C1 cycle, the lower 2 bits vary in the order shown in Table 1. In case the burst length is "4", the portions other than the lower 2 bits are fixed.

TABLE 2

Interleave type internal column address

| STARTING ADDRESS | | INTERNAL ADDRESS |
|---|---|---|
| A1 | A0 | SEQUENCE (DECIMAL) |
| 0 | 0 | 0,1,2,3 |
| 0 | 1 | 1,0,3,2 |
| 1 | 0 | 2,3,0,1 |
| 1 | 1 | 3,2,1,0 |

Table 2 shows the case where the burst type is an inter-leave type, where the lower 2 bits only vary in the same manner.

As reviewed above, the art which has a burst counter 12 and automatically forms addresses in order internally has come to be generalized along with the tendency for the CPU to become high speed, and there are more frequently available the synchronous type semiconductor memory devices wherein the two types of the sequential type in which the lower 2 bits are subjected to increment in order as the address sequence and the inter-leave type in which an exclusive logical sum of present address and starting address is selected as the next address, may be selected by the user.

In FIG. 8, IY0 shows the lowermost bit of the internal column address, and IY1 shows the second bit from the lower part of the internal column address. IY0 varies in synchronization with the internal synchronous signal ICLK1 as Low, High, Low, High, and IY1 likewise varies as Low, Low, High, High. The column switch YSW varies according to the internal column address IADD.

Further, when the write-in data to the terminal DQ in each cycle of C1, C2, C3, C4 are sequentially set to be Low, High, Low, High, the level of the write bus WBUS1 varies as Low, High, Low, High in synchronization with the internal synchronous signal ICLK1, and the level of the write bus WBUS2 varies as Low, High, Low, High in synchronization with the internal synchronous signal ICLK2.

By adjusting the formation of the internal synchronous signal ICLK2 to be in tune with the selection of the column switch YSW, the write-in data on the write bus WBUS2 can be written in the sense amplifier selected by the column switch YSW in the sense amplifiers 9. Thereafter, the write-in data are written in the memory cell in the memory cell array 10 through the bit line.

In the write bus WBUS1, WBUS2 there exist the parasitic capacities C1, C2, respectively (ref. FIG. 1), and when the write-in data on each cycle vary as in the example of FIG. 8, the charge for the capacity of (C1+C2) is to be charged or discharged for each cycle.

However, as the conventional semiconductor memory device as described above is so constituted that, according to the variation of the write-in data in the terminal DQ, the levels of the write bus WBUS1, WBUS2 also vary accordingly, there is a problem that, in case of the change of the write-in data on each cycle, the parasitic capacities C1 and C2 are charged or discharged on each cycle.

In consequence of the increase in the chip size resulting from the enlargement in capacity of the semiconductor memory device in recent years, there is a tendency for the wiring length of the write bus to become longer, with increase in the parasitic capacity thereof.

Furthermore, there is also a tendency for a plurality of the terminals DQ for inputting the write-in data to be provided so as to write a large number of data in parallel. Accompanied with this, a plurality of write buses WBUS 1, 2 are provided. Accordingly, the subject of increase in current consumption due to the charge and discharge of write bus can no longer be neglected.

SUMMARY OF THE INVENTION

An object of the present invention is to provide a semiconductor memory device with which the maximum consumptive current amount can be reduced.

Another object of the present invention is to provide a semiconductor memory device with which the average consumptive current in burst can be reduced.

The semiconductor memory device according to the present invention comprises a memory cell, an internal synchronous signal generating circuit for generating an internal synchronous signal in synchronization with the reference signal from outside, a burst counter utilizing the external address inputted from outside in the first cycle of said reference signal as a starting address and forming an internal address signal in a regular order in synchronization with the internal synchronous signal, a data bus for transmitting the memory data of the memory cell, and means for determining whether to invert the polarity of the data to be transmitted or not, depending on the level of the lowermost address of the internal address signal in the transmission of the data from the first block in which the data bus is continued to the second block.

Further, the semiconductor memory device according to the present invention comprises a memory cell, an internal synchronous signal generating circuit for generating an internal synchronous signal in synchronization with the reference signal from outside, a burst counter utilizing the external address inputted from outside in the first cycle of said reference signal as a starting address and forming an internal address signal in a regular order in synchronization with the internal synchronous signal, a data bus for transmitting the memory data of the memory cell, and means for not inverting the polarity of the data to be transmitted at the time of the transmission with the first route and inverting the polarity of the data to be transmitted at the time of the transmission with the second route, in the data transmission between the first section having the common route without resorting to the internal address and the continued second section in which at least the first route and the second route are selected in the data bus.

In the present invention, preferably, both the data write-in bus to the memory cell and the data read-out bus from the memory cell determine the polarity of the data by the same rule in the data transmission between the first section and the second section, respectively.

According to the present invention, by constituting so that a part of the data bus is driven by changing the polarity according to the lowermost bit of the internal column address which is changed over on each cycle regardless of whether the burst type is sequential type or interleave type, there is given an effect that the level hangeover of the data bus generates only in a part, or the probability for changeover of the level is reduced, thereby making it possible to reduce the maximum consuming current amount or to reduce the average consumptive current in the burst.

DESCRIPTION OF THE PREFERRED EMBODIMENT

Figure 1:
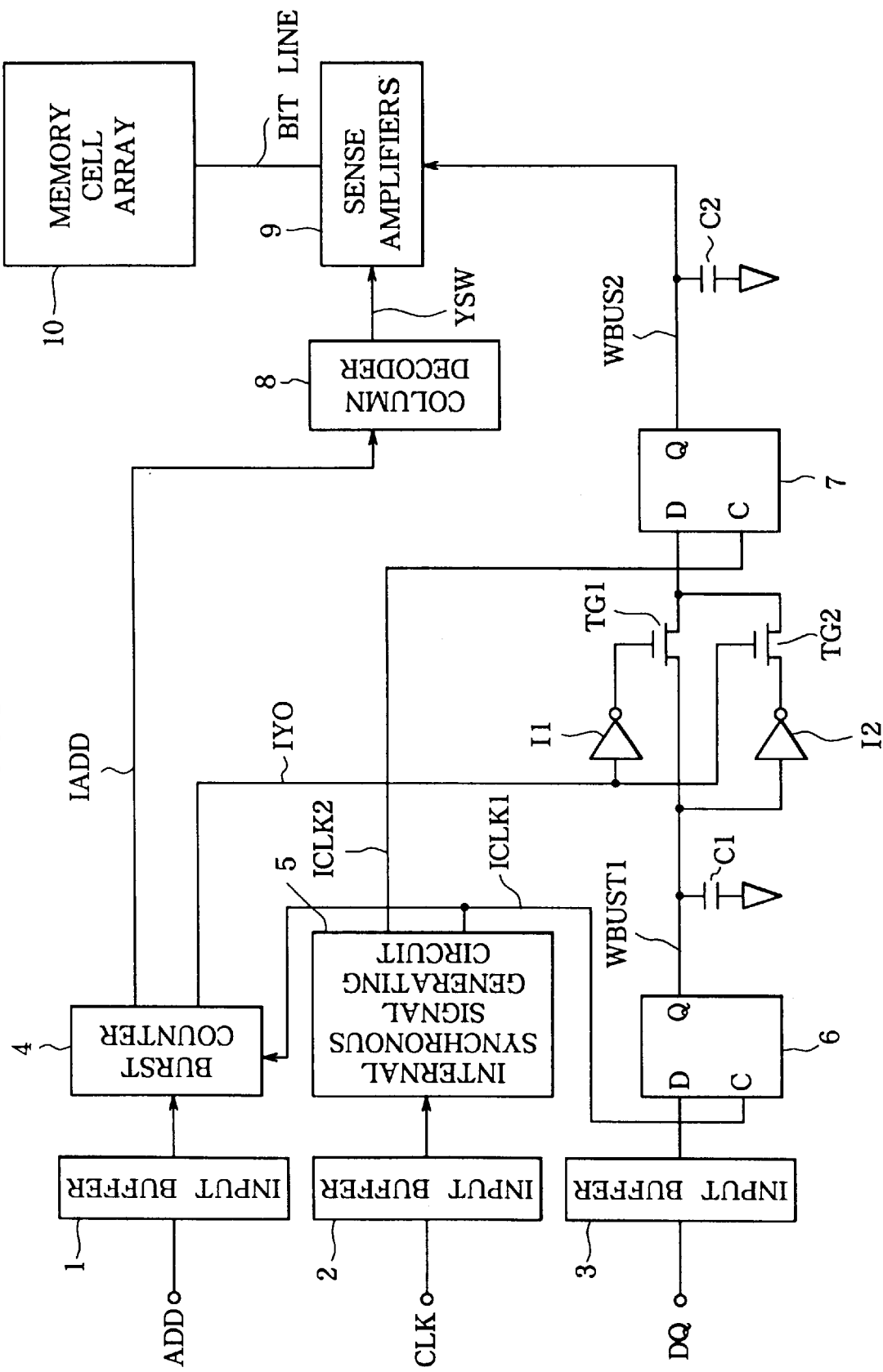
FIG. 1 is a view showing a circuit constitution of a first embodiment of the present invention.

Preferred embodiments of the present invention are illustrated hereinafter with reference to the accompanying drawings. FIG. 1 is a view showing a circuit constitution of one embodiment of the present invention, which shows an example of the present invention applied to the write-in data bus. The semiconductor memory device of the present invention comprises, in its preferred embodiment, an internal synchronous signal generating circuit 5 (FIG. 1) for generating an internal synchronous signal ICLK1, ICLK2 (FIG. 2) in synchronization with the reference signal from outside, a burst counter 4 (FIG. 1) utilizing the external address inputted from outside in the first cycle of said reference signal as a starting address and forming an internal address signal (IADD) in a regular order in synchronization with the internal synchronous signal, a data bus for transmitting the memory data of the memory cell, and circuit means (inverters I1, I2, transfer gates TG1, TG2, in FIG. 1) for inverting the polarity of the data to be transmitted, depending on the level of the lowermost address (IY0) of the internal address signal in the transmission of the data from the first block (write bus WBUS1) in which the data bus is continued to the second block (write bus WBUS2).

In the embodiment of the present invention, constitution is made to drive by varying the polarity of the write bus (WBUS2) according to the lowermost position bit (IY0) of the internal address signal (IY0) which is changed over on each cycle. Accordingly, of the write bus, the level changeover occurs only in a part. As a result, it is possible to expect reduction of the maximum consumptive current amount, or reduction of the average consumptive urrent in burst.

Referring to FIG. 1, the semiconductor memory device according to the present embodiment comprises an input buffer 1 for inputting an address signal ADD, an input buffer 2 for inputting an external clock CLK and an input buffer 3 connected to a terminal DQ for inputting the written data. An internal synchronous signal generating circuit 5 inputs an output of the input buffer 2 and outputs the internal synchronous signals ICLK1 and ICLK2. A burst counter 4 inputs an output of the input buffer 1 and the internal synchronous signal ICLK1 and outputs an internal column address signal IADD and an internal column address signal IY0. A D-type flip-flop (D-F/F) circuit 6 inputs an output of the input buffer 3 and drives a write bus WBUS1 in synchronization with the internal synchronous signal ICLK1. An inverter I1 inputs an internal column address signal IY0. An inverter I2 inputs an output of the D-F/F circuit 6. A D-F/F circuit 7 drives a write bus WBUS2 in synchronization with the internal synchronous signal ICLK2. An N-channel type transistor TG1 is connected between the data input terminals of the write bus WBUS1 and D-F/F circuit 7, and the gate is connected to the output of the inverter I1. An N-channel type transistor TG2 is connected between the output of the inverter I2 and the data input terminal of the D-F/F circuit 7 and inputs an internal column address signal IY0 in the gate. A column decoder 8 inputs an internal column address signal IADD and outputs a column switch YSW. Sense amplifiers 9 input a column switch YSW and a write bus WBUS2. A memory cell array 10 is connected to the sense amplifiers 9 through a bit line.

Figure 2:
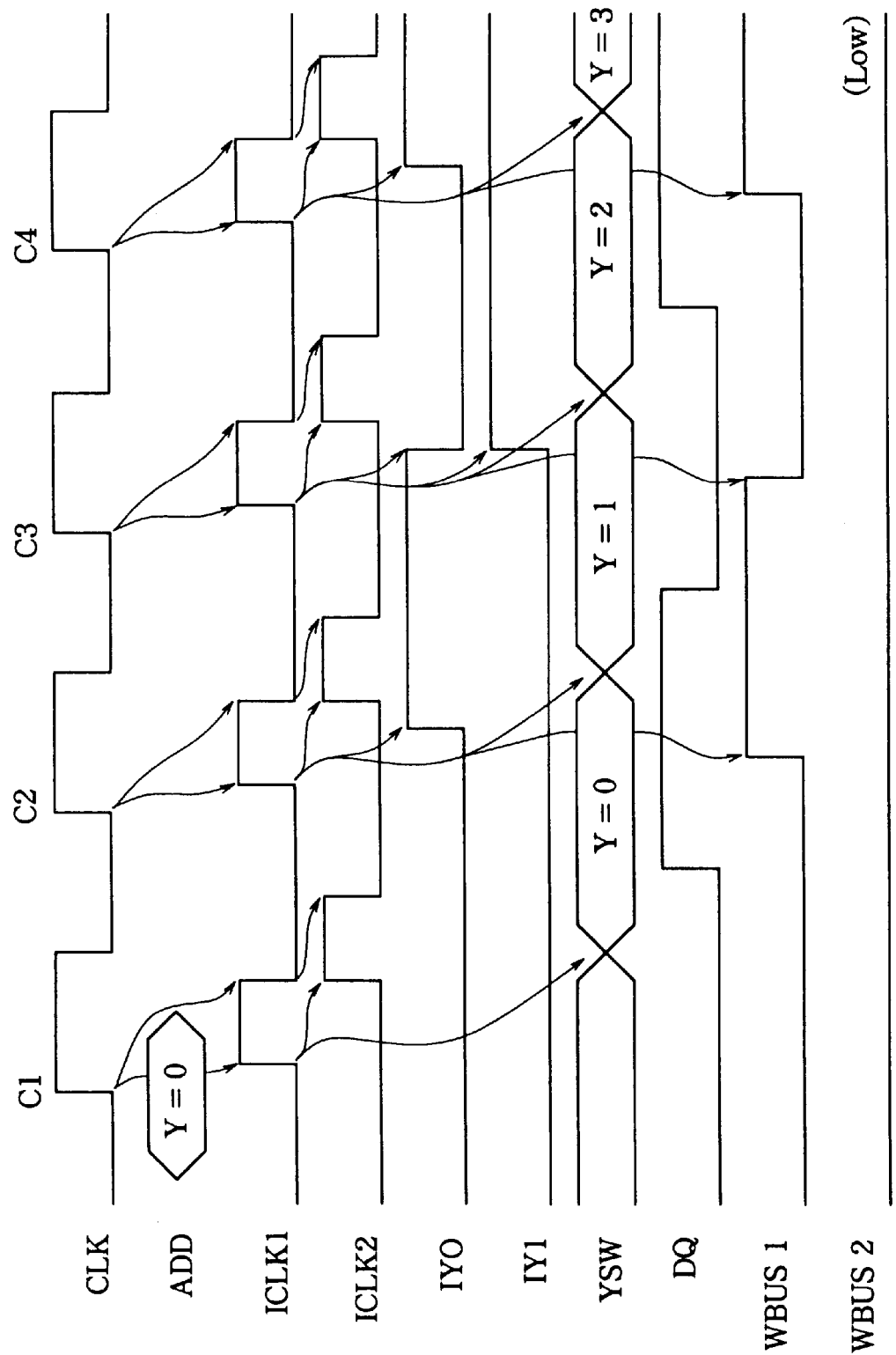
FIG. 2 is a signal waveform view for illustrating an operation of a first embodiment of the present invention.

FIG. 2 is a waveform diagram showing an example of the operation of an embodiment of the present invention, representing the case where the written data in the terminal DQ are changed over on each cycle.

The internal synchronous signal ICLK1 is a pulse directly produced from the rising edge of the external clock CLK (transition from Low level to High level), and the internal synchronous signal ICLK2 is a pulse to be produced after the predetermined delay from the internal synchronous signal ICLK1.

Figure 8:
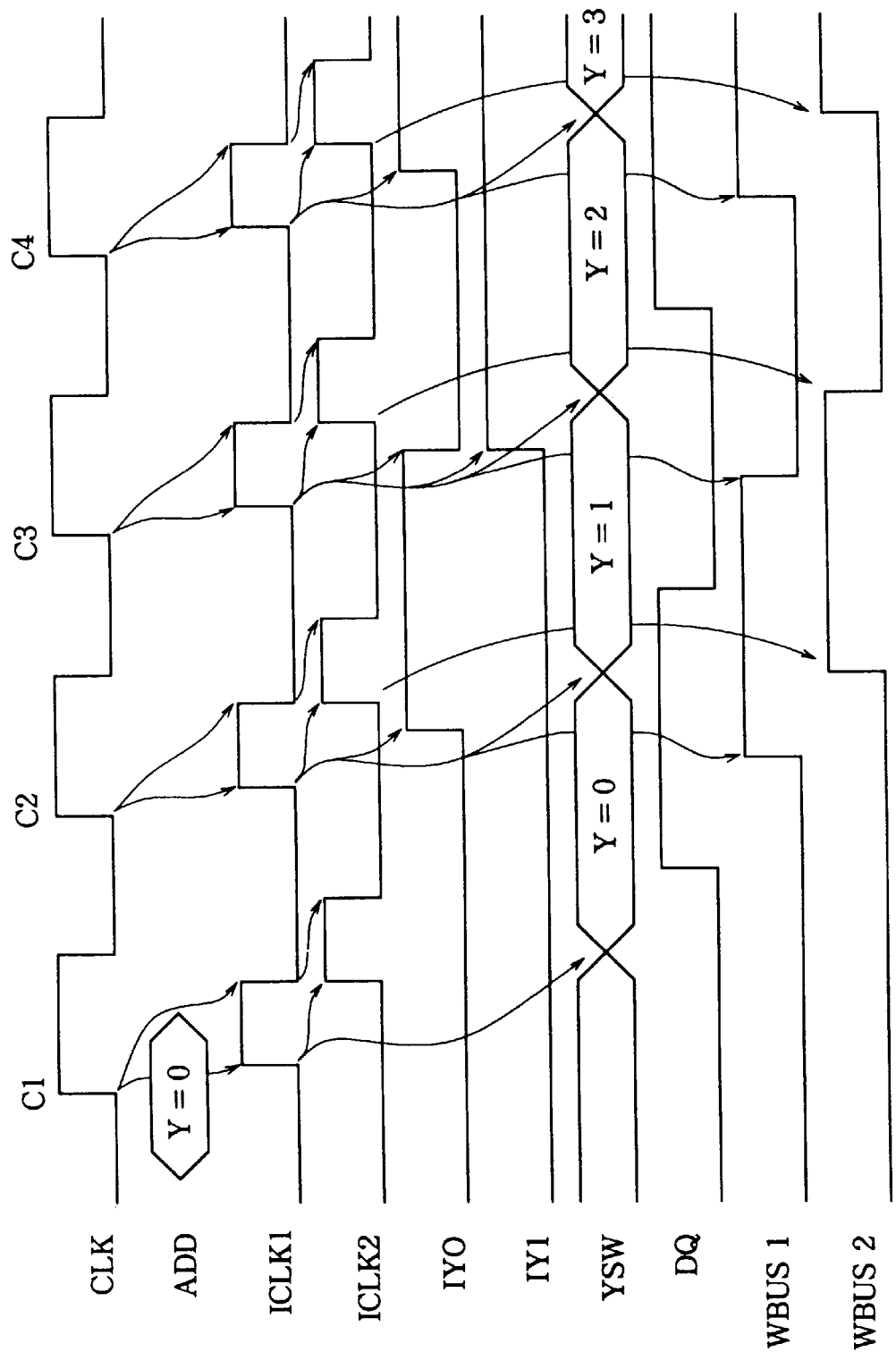
FIG. 8 is a signal waveform view for illustrating an operation of a conventional synchronous type semiconductor memory device.

In the same manner as in the conventional synchronous type semiconductor memory device shown in FIG. 8, if setting is made to a sequential burst type in a burst length of 4, when Y=0 is given to an external address signal ADD at the rising edge of the external clock CLK in the C1 cycle which becomes the starting point of the writing operation, there are produced the internal column address IADD of Y=0, Y=1, Y=2, and Y=3, respectively, in the cycles of C1, C2, C3 and C4, in synchronization with the internal synchronous signal ICLK1.

Assuming that the internal column address signal IY0 shows the lowermost position bit of the internal column address, and IY1 in FIG. 2 shows the second bit from the lower position of the internal column address, the internal column address signal IY0 varies in synchronization with the internal synchronous signal ICLK1 to Low, High, Low, High, and IY1 varies likewise to Low, Low, High, High. The column switch YSW varies according to the internal column address IADD.

Also, assuming that the written data in the terminal DQ in the cycles C1, C2, C3, C4 are sequentially Low, High, Low, High, the levels of the write bus WBUS1 vary to Low, High, Low, High in synchronization with the internal synchronous signal ICLK1, but the level of the write bus WBUS2 remains at Low without change.

This is because, in C1 cycle and C3 cycle, the internal column address signal IY0 becomes a Low level, and the N channel type transistor TG1 is turned ON, the Low level written data of write bus WBUS1 are inputted straight in D-F/F circuit 7, and accordingly, in synchronization with the internal synchronous signal ICLK2, the Low level written data is outputted to the write bus WBUS2, and in the C2 cycle and C4 cycle the internal column address signal IY0 becomes High level, and the N channel type transistor TG2 is put ON, by which the High level written data of the write bus WBUS1 is inverted by the inverter I2 and inputted as Low level to D-F/F circuit 7. Consequently, in synchronization with the internal synchronous signal ICLK2, the Low level written data is outputted to the write bus WBUS2.

Accordingly, the electric charge of the parasitic capacity C2 of the write bus WBUS2 is not charged or discharged notwithstanding the changeover of the written data in the terminal DQ on each cycle.

Figure 3:
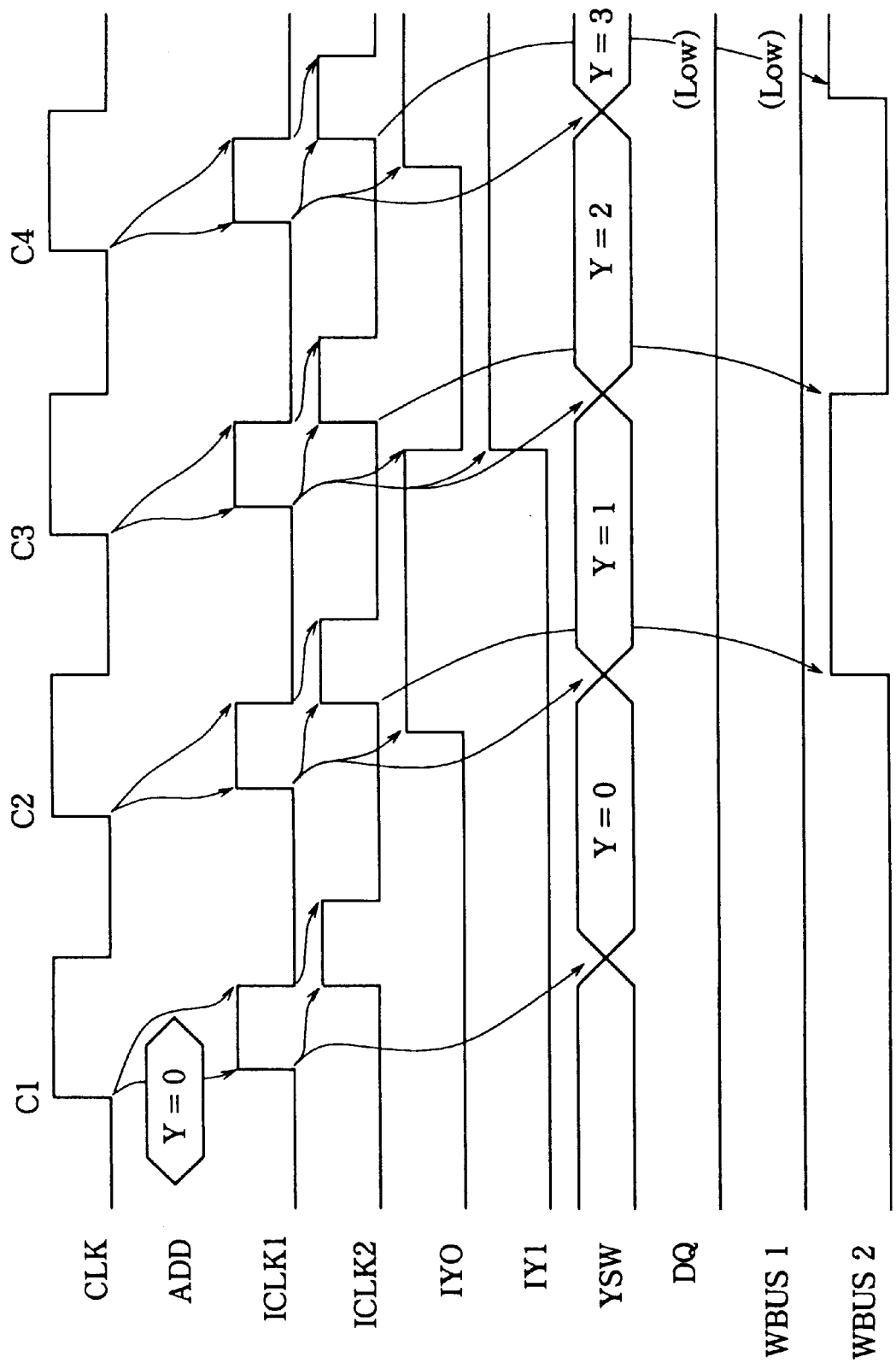
FIG. 3 is a signal waveform view for illustrating an operation of a first embodiment of the present invention.

FIG. 3 is a waveform diagram showing the operation of the first embodiment, representing the case where the data written into the terminal DQ is not changed over.

The operations of each internal synchronous signal and internal column address signal are the same as those shown in FIG. 2.

When the data written into the terminal DQ in the cycles C1, C2, C3, C4 are fixed to Low, the level of the write bus WBUS1 is also fixed to Low, but the level of the write bus WBUS2 varies to Low, High, Low, High.

This is because, in C1 cycle and C3 cycle, the internal column address signal IY0 becomes a Low level, and the N channel type transistor TG1 is turned ON, the Low level written data of write bus WBUS1 are inputted straight in D-F/F circuit 7, and accordingly, in synchronization with the internal synchronous signal ICLK2, the Low level written data is outputted to the write bus WBUS2, and in the C2 cycle and C4 cycle the internal column address signal IY0 becomes High level, and the N channel type transistor TG2 is put ON, by which the Low level written data of the write bus WBUS1 is inverted by the inverter I2 and inputted as High level to D-F/F circuit 7. Consequently, in synchronization with the internal synchronous signal ICLK2, a High level written data is outputted to the write bus WBUS2.

In addition, by adjusting the production of the internal synchronous signal ICLK2 to be in tune with the changeover of the column switch YSW, the written data on the write bus WBUS2 is written in the sense amplifier selected by the column switch YSW in the sense amplifiers 9, and thereafter, into the memory cell in the memory cell array 10 through the bit line.

As in the example shown as a waveform diagram in FIG. 2, when each cycle writing data inputted from the terminal DQ varies, the electric charge for the capacity of C1 is charged or discharged on each cycle, and as in the example shown as a waveform diagram in FIG. 3, unless the written data is not varied, the charge for the capacity of C2 is charged or discharged on each cycle. Namely, in whatever case of the variation of the written data, charge/discharge is to take place only for either C1 or C2 of the parasitic capacities.

Figure 7:
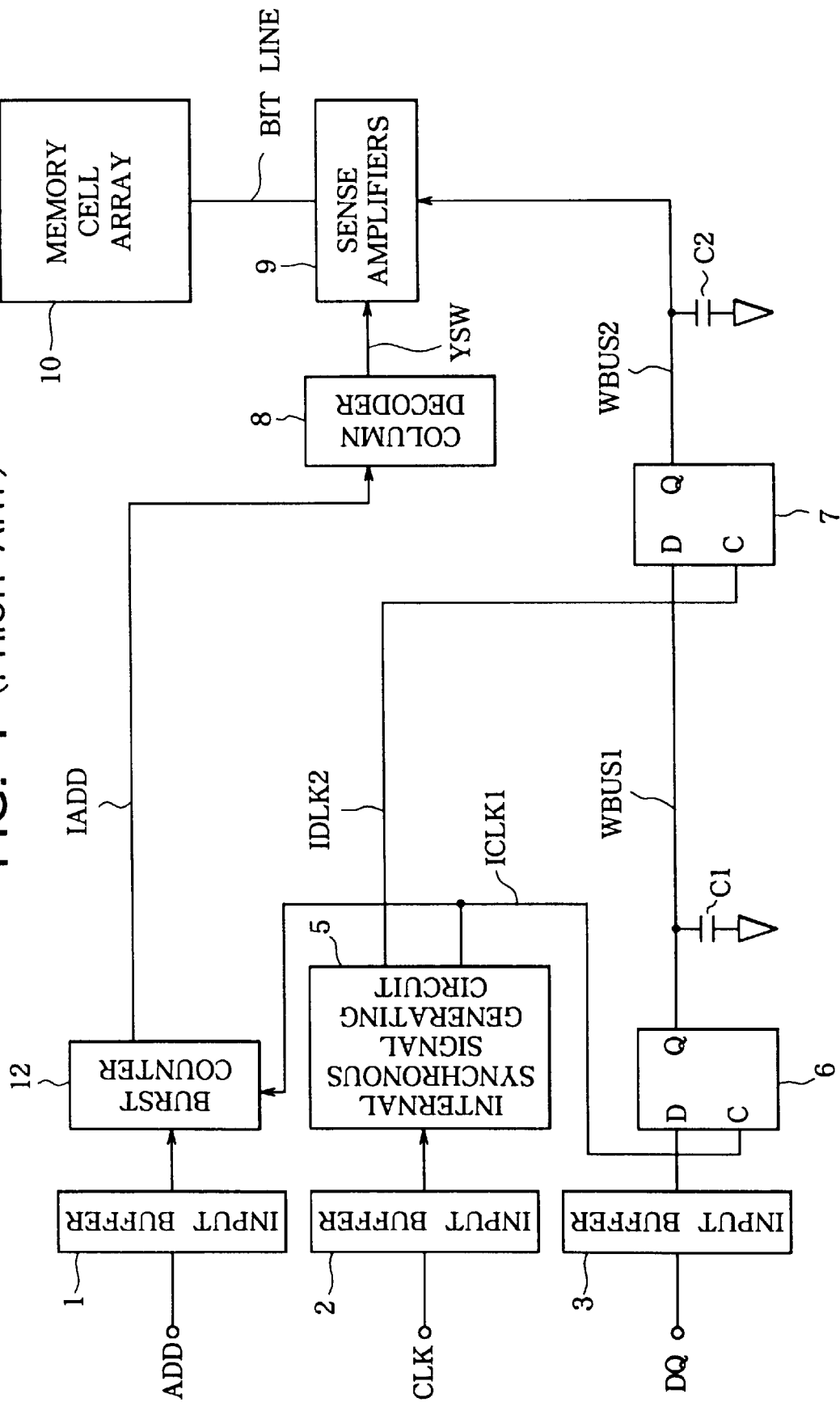
FIG. 7 is a view showing an example of a circuit constitution of a conventional synchronous type semiconductor memory device.

Thus, when the arrangement of the D-F/F circuit 7 is contrived to make C1=C2, the current consumption is best reduced, and the maximum current consumption that can be consumed in the write bus WBUS2, WBUS2 becomes ½ in comparison with the prior art shown in FIG. 7.

On the other hand, in reading out the data, normal operation can be made by similarly controlling with IY0 at one place on the reading bus.

Figure 4:
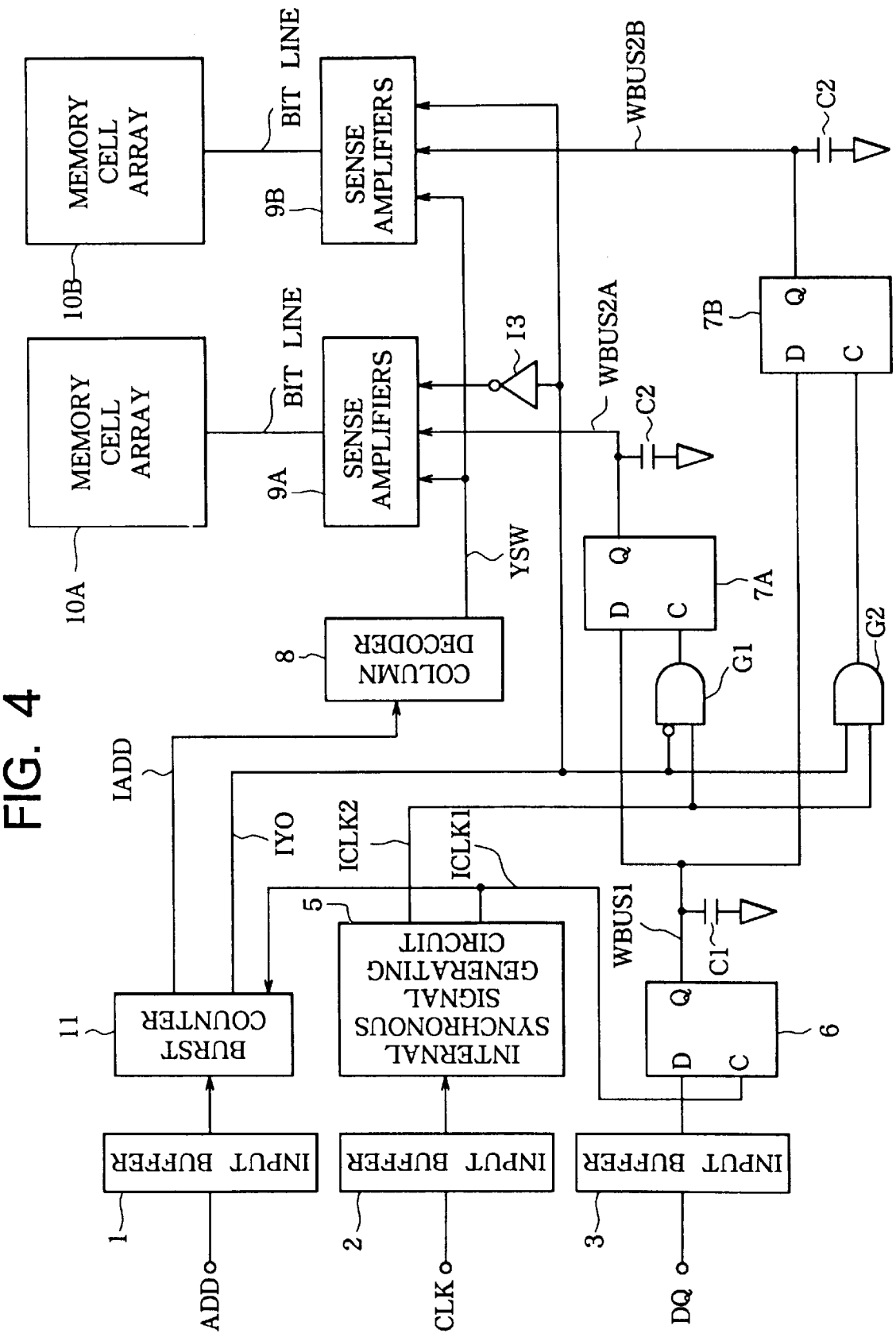
FIG. 4 is a view showing a circuit constitution of a second embodiment of the present invention.

Next, the second embodiment of the present invention is explained. FIG. 4 is a view showing a circuit constitution of the second embodiment of the present invention.

In this second embodiment, the circuit is constituted by an internal synchronous signal generating circuit 5 (FIG. 4) for generating an internal synchronous signal in synchronization with the reference signal from outside, a burst counter 11 (FIG. 4) utilizing the external address inputted from outside in the first cycle of said reference signal as a starting address and forming an internal address signal (IADD) in a regular order in synchronization with the internal synchronous signal, a data bus for transmitting the memory data of the memory cell, and means for not inverting the polarity of the data to be transmitted at the time of the transmission with the first route and inverting the polarity of the data to be transmitted at the time of the transmission with the second route, in the data transmission between the first section (WBUS1) having the common route without resorting to the internal address and the continued second section in which at least the first route (WBUS2A) and the second route (WBUS2B) are selected in said data bus.

Referring to FIG. 4, the semiconductor memory device according to the second embodiment of the present invention is described hereafter. An input buffer 1 inputs an address signal ADD. An input buffer 2 inputs an external clock CLK. An input buffer 3 is connected to a terminal DQ for inputting the written data. An internal synchronous signal generating circuit 5 inputs an output of the input buffer 2 and outputs the internal synchronous signals ICLK1 and ICLK2. A burst counter 4 inputs an output of the input buffer 1 and the internal synchronous signal ICLK1 and outputs an internal column address signal IADD and an internal column address signal IY0. A D-F/F circuit 6 inputs an output of the input buffer 3 and drives a write bus WBUS1 in synchronization with the internal synchronous signal ICLK1. An AND logic gate Gi is AND of inverse polarity of an internal column address signal IY0 and an internal synchronous signal ICLK2. An AND logic gate G2 is AND of an internal column address signal IY0 and an internal synchronous signal ICLK2. A D-F/F circuit 7A inputs a write bus WBUS1 and drives a write bus WBUS2A in synchronization with the output signal of the logic gate G1. A D-F/F circuit 7B inputs a write bus WBUS1 and drives a write bus WBUS2B in synchronization with the output signal of the logic gate G2. An inverter I3 inputs an internal column address signal IY0. A column decoder 8 inputs an internal column address signal IADD and outputs a column switch YSW. Sense amplifiers 9A input a column switch YSW, an output of an inverter I3 and a write bus WBUS2. Sense amplifiers 9B input a column switch YSW, an internal column address signal IY0 and a write bus WBUS2B. A memory cell array 10A is connected to the sense amplifiers 9A through a bit line. A memory cell array 10B is connected to the sense amplifiers 9B through a bit line.

Against the fact that in the above first embodiment as shown in FIG. 1 the selection of the column switch YSW is made at the lowermost bit of the column address, in the second embodiment of the present invention constitution is made so that the selection of the sense amplifiers is made at the lowermost bit of the column address.

Figure 5:
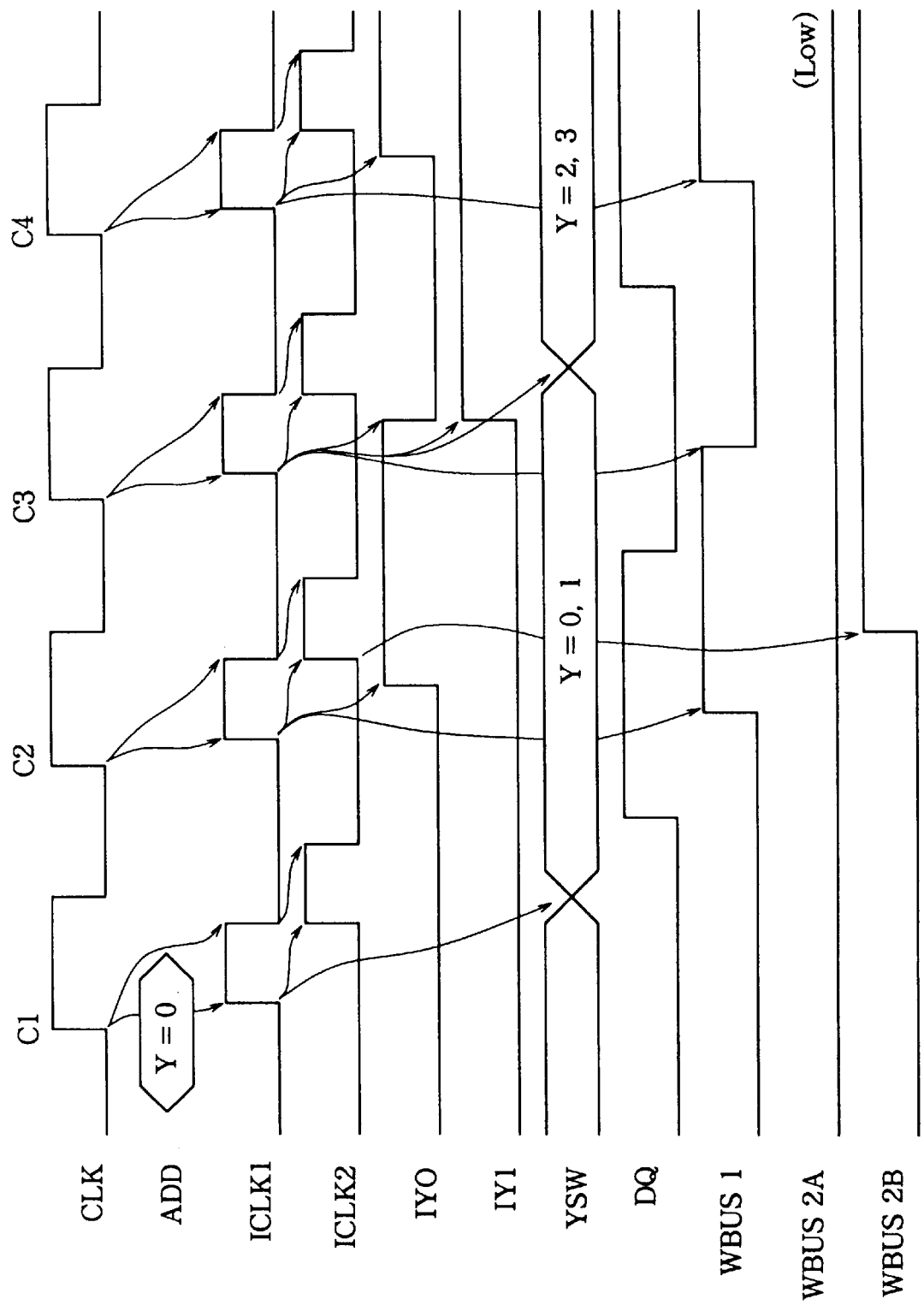
FIG. 5 is a signal waveform view for illustrating an operation of a second embodiment of the present invention.

FIG. 5 is a waveform diagram showing an example of the operation of the second embodiment of the present invention, representing the case where the written data in the terminal DQ are changed over on each cycle.

The internal synchronous signal ICLK1 is a pulse directly produced from the rising edge of the external clock CLK (transition from Low level to High level), and the internal synchronous signal ICLK2 is a pulse to be produced after the predetermined delay from the internal synchronous signal ICLK1.

In the same manner as in the conventional synchronous type semiconductor memory device shown in FIG. 8, if setting is made to a sequential burst type in a burst length of 4, when Y=0 is given to an external address signal ADD at the rising edge of the external clock CLK in the C1 cycle which becomes the starting point of the writing operation, there are produced the internal column address IADD of Y=0, Y=1, Y=2, and Y=3, respectively, in the cycles of C1, C2, C3 and C4, in synchronization with the internal synchronous signal ICLK1. However, because in this embodiment the lowermost address of the column is not concerned with the selection of the column switch YSW, the column switch YSW is to be changed at the time when the second bit from the lowermost position of the internal column address has shown a change.

Assuming that the internal column address signal IY0 shows the lowermost position bit of the internal column address, and IY1 in FIG. 2 shows the second bit from the lower position of the internal column address IADD, the internal column address signal IY0 varies in synchronization with the internal synchronous signal ICLK1 to Low, High, Low, High, and IY1 varies likewise to Low, Low, High, High.

Here, assuming that the written data in the terminal DQ in the cycles C1, C2, C3, C4 are sequentially Low, High, Low, High, the levels of the write bus WBUS1 vary to Low, High, Low, High in synchronization with the internal synchronous signal ICLK1, but the level of the write bus WBUS2A does not change at Low, and the level of the write bus WBUS2B also does not change at High after once having become High.

This is because, in C1 cycle and C3 cycle, the internal column address signal IY0 becomes a Low level, and the pulse of the internal synchronous signal ICLK2 is propagated to the output of the logical gate G1, and from the D-F/F circuit 7A in which the Low level written data of write bus WBUS1 are inputted, and in synchronization with the internal synchronous signal ICLK2, the Low level written data is outputted to the write bus WBUS2A, and in the C2 cycle and C4 cycle the internal column address signal IY0 becomes High level, and the pulse of the internal synchronous signal ICLK2 is propagated to the output of the logical gate G2. Consequently, in synchronization with the internal synchronous signal ICLK2, High level written data is outputted to the write bus WBUS2B from the D-F/F circuit 7B in which the High level written data the bus WBUS1 is inputted.

The electric charge of the parasitic capacity C2A, 2B of the write bus WBUS2A, WBUS2B is not charged or discharged notwithstanding the changeover of the written data in the terminal DQ on each cycle.

By adjusting the formation of the internal synchronous signal ICLK2 to meet the changeover of the column switch YSW, the written data on WBUS2A, WBUS2B are written in the sense amplifier selected by the column switch YSW in the sense amplifiers 9A or 9B, and thereafter written into the memory cell in the memory cell array 10A or 10B through the bit line.

Figure 6:
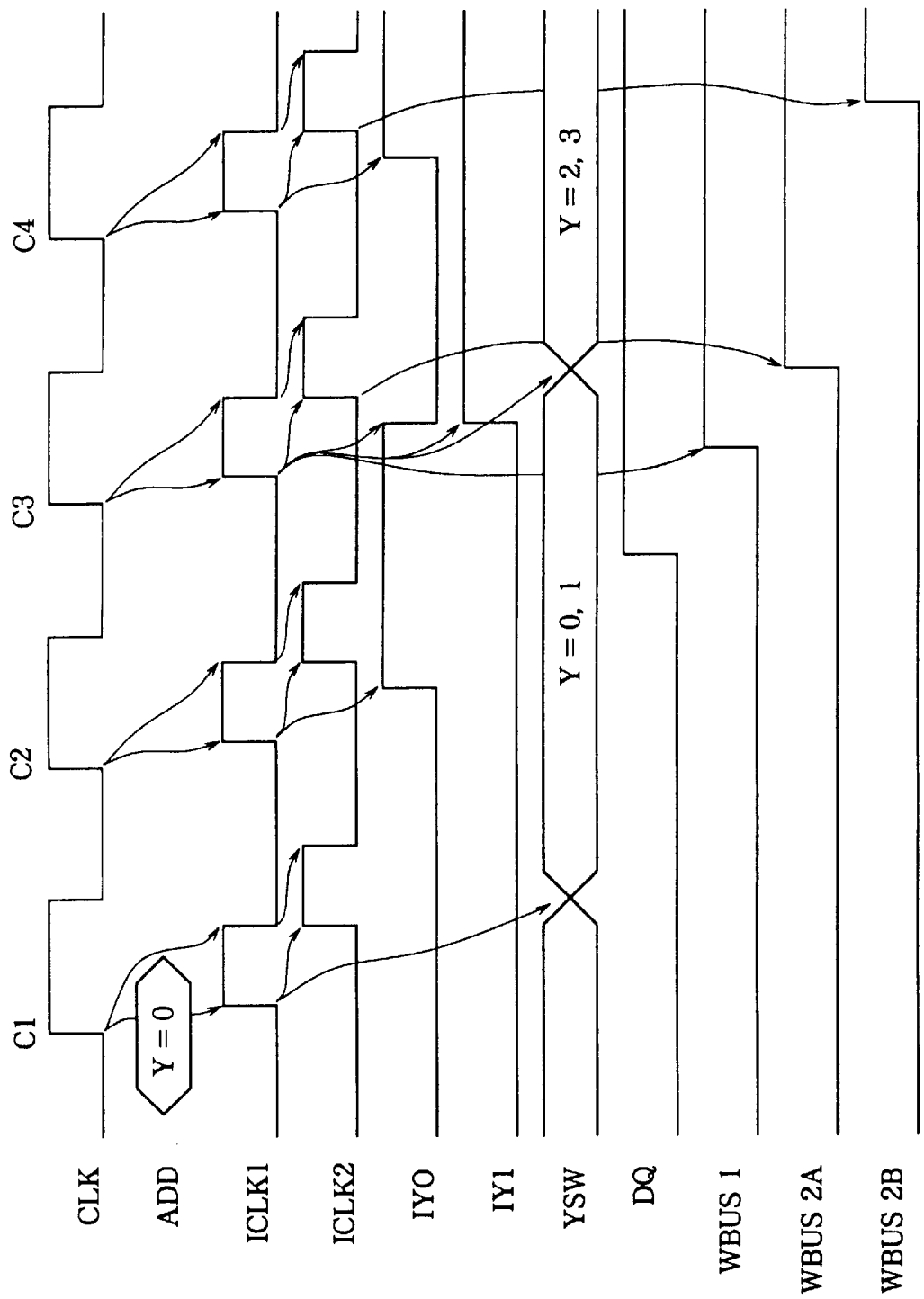
FIG. 6 is a signal waveform view for illustrating an operation of a second embodiment of the present invention.

FIG. 6 is a waveform diagram showing the operation of the second embodiment, representing the case where the data written into the terminal DQ is changed over at the rate of once in 2 cycles.

The operations of each internal synchronous signal and internal column address signal are the same as those shown in FIG. 5.

When the data written into the terminal DQ in the cycles C1, C2, C3, C4 are set to Low, Low, High, High in order, the level of the write bus WBUS1 varies to Low, Low, High, High in order in synchronization with the internal synchronous signal ICLK1, and the levels of the write bus WBUS2A, WBUS2B likewise vary once in 2 cycles.

In the case of this example, all the electric charges of the parasitic capacities C1, C2A, and C2B are charged or discharged, but their rates are only once in 2 cycles, and no charge or discharge in each cycle occurs.

When the written data into the terminal DQ in C1, C2, C3, C4 cycles do not vary in Low or High, the write bus WBUS1, WBUS2A, and WBUS2B all do not show level change, and accordingly, the electric charges of the parasitic capacities C1, C2A, and CB are not charged or discharged.

In the case of this embodiment, in whatever case of the written data variation, neither the parasitic capacity C1 of the write bus WBUS1B, nor the parasitic capacity C2A of the write bus WBUS2A, nor the parasitic capacity C2B of the write bus WBUS2B, is not charged or discharged on each cycle.

Now, the probability for the level of the write bus WBUS1 to change in a certain cycle is ½, the probability for the level of the write bus WBUS2A to change is ¼ because it is due to the polarity of IY0 and the written data of the previous cycle, and the probability for the level of the write bus WBUS2B to change is likewise ¼.

Consequently, the case in which the average consumptive current in the burst can be reduced to the greatest extent is where the arrangements of the D-F/F circuits 7A and 7B are contrived to make 2×C1=C2A C2B, at which time the average consumptive current in the write bus WBUS1, WBUS2A and WBUS2B becomes ⅔ in comparison with the prior art shown in FIG. 7.

The foregoing explanations have been made on the example of the data writing bus, but the invention can be applied to the data reading bus according to the principle entirely same as that described above.

What is claimed is:

1. A semiconductor memory device comprsing:
   a memory cell;
   an internal synchronous signal generating circuit for generating an internal synchronous signal in synchronization with a reference signal from outside,
   a burst counter utilizing an external address inputted from outside in a first cycle of said reference signal as a starting address and forming an internal address signal in a regular order in synchronization with the internal synchronous signal;
   a data bus for transmitting a memory data of the memory cell; and
   means for determining whether to invert the polarity of the data to be transmitted or not, depending on a level of a lowermost address of the internal address signal in the transmission of the data from a first block in which the data bus is continued to a second block.

2. A semiconductor memory device comprising:
   a memory cell;
   an internal synchronous signal generating circuit for generating an internal synchronous signal in synchronization with a reference signal from outside;
   a burst counter utilizing an external address inputted from outside in a first cycle of said reference signal as a starting address and forming an internal address signal in a regular order in synchronization with the internal synchronous signal;
   a data bus for transmitting a memory data of the memory cell; and
   means for not inverting the polarity of the data to be transmitted at a time of the trasmission with a first route and inverting the polarity of the data to be transmitted at the time of the transmission with a second route, in the data transmission between a first section having a common route without resorting to the internal address and a continued second section in which at least the first route and the second route are selected in said data bus.

3. The semiconductor memory device according to claim 2, wherein both a data write-in bus to the memory cell and a data read-out bus from the memory cell determine the polarity of the data by the same rule in the data transmission between the first section and the second section, respectively.

4. A semiconductor memory device comprising:
   an internal synchronous signal generating circuit for generating an internal synchronous signal in synchronization with a reference signal from outside;
   a burst counter utilizing an external address inputted from outside in a first cycle of said reference signal as a starting address and forming an internal address signal in a regular order in synchronization with the internal synchronous signal;
   a first and a second write bus for transmitting data inputted from a data input terminal to sense amplifiers of a memory cell array, being formed by being classified into first and second sections; and
   means for sitting the data of the first write bus or an amount obtained by inverting said data to the second write bus by latching with said internal synchronous signal.

* * * * *